United States Patent [19]
Furutani et al.

[11] Patent Number: 6,111,478
[45] Date of Patent: Aug. 29, 2000

[54] FILTER WITH A SWITCH HAVING CAPACITANCE

[75] Inventors: Koji Furutani, Moriyama; Norio Nakajima, Takatsuki; Ken Tonegawa, Otsu, all of Japan

[73] Assignee: Murata Manufacturing Co., Ltd., Japan

[21] Appl. No.: 09/168,641

[22] Filed: Oct. 8, 1998

[30] Foreign Application Priority Data

Oct. 8, 1997 [JP] Japan ................................ 9-275811

[51] Int. Cl.[7] ............................................... H03H 7/01
[52] U.S. Cl. .......................... 333/174; 333/104; 333/134; 333/185
[58] Field of Search .................................. 333/174, 175, 333/184, 185, 104, 132, 134

[56] References Cited

U.S. PATENT DOCUMENTS

| | | | |
|---|---|---|---|
| 5,473,293 | 12/1995 | Chigodo et al. | 333/104 |
| 5,783,976 | 7/1998 | Furutani et al. | 333/134 |
| 5,926,075 | 7/1999 | Hayashi | 333/132 X |

FOREIGN PATENT DOCUMENTS

| | | | |
|---|---|---|---|
| 1-233817 | 9/1989 | Japan | 333/174 |
| 3-272213 | 12/1991 | Japan | 333/134 |

*Primary Examiner*—Justin P. Bettendorf
*Attorney, Agent, or Firm*—Ostrolenk, Faber, Gerb & Soffen, LLP

[57] ABSTRACT

A filter 10 (30) includes a laminate body 11 (31), PIN diodes PD1 and PD2 of switching elements and choke coils CC1–CC2 are mounted on a top surface or a principal face of the laminate body 11, and six external electrodes Ta–Tf extend on a side surface from the top surface to the bottom surface of the laminate body 11 (31). Three external electrodes Ta–Tc among the external electrodes Ta–Tf are formed on one side surface of the laminate body 11 (31), and three other external electrodes Td–Tf are formed on the opposing side surface of the laminate body laminate body 11 (31). The external electrode Ta is an input terminal, the external electrodes Tb and Te are control terminals for controlling a voltage supplied to the PIN diode PD, the external electrode Tc is an output terminal, and the external electrodes Td and Tf are ground terminals.

11 Claims, 6 Drawing Sheets

FILTER WITH A SWITCH HAVING CAPACITANCE

BACKGROUND OF THE INVENTION

1. Industrial Field of the Invention

The present invention relates to a filter for use in a mobile communications apparatus, for example, a portable telephone and the like working on a plurality of frequency bands.

2. Description of the Related Art

Figure 9:
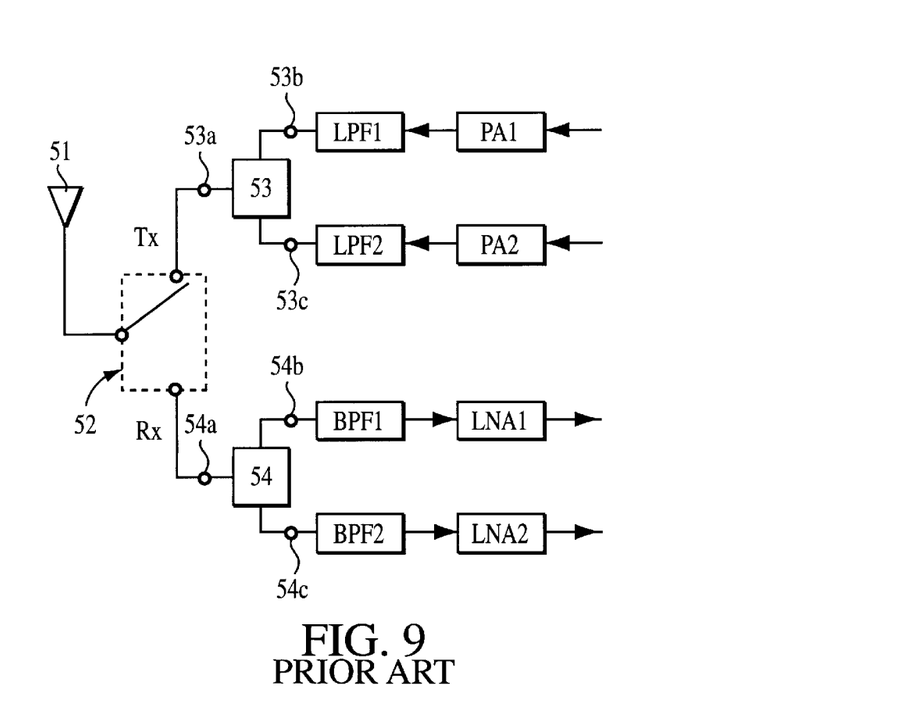
FIG. 9 is a block diagram showing a conventional system in which an antenna is shared by mobile communications apparatuses working on different frequency bands.

When two communication frequency bands are close to each other, one antenna is conventionally shared by mobile communications apparatuses working on the two frequency bands. FIG. 9 is a block diagram showing a conventional system in which an antenna is shared by mobile communications apparatuses working on different frequency bands. Referring to FIG. 9, there are shown an antenna 51, antenna 51, a switch 52 constructed of a coaxial switch 52, a PIN diode and the like, a duplexer 53 on a transmitter (Tx) side, and a duplexer 54 on a receiver (Rx) side. A first terminal 53a of the duplexer 53 is connected to the antenna 51 via the switch 52, and second and third terminals 53b and 53c are respectively connected to a Tx side high-power amplifier PA1 working on a 900 MHz band and a Tx side high-power amplifier PA2 working on a 1.8 GHz band, respectively via low-pass filters LPF1 and LPF2. Similarly, a first terminal 54a of the duplexer 54 is connected to the antenna 51 via the switch 52, and second and third terminals 54b and 54c are respectively connected to an RX side low-noise amplifier LNA 1 working on the 900 MHz band and an Rx side low-noise amplifier LNA 2 working on the 1.8 GHz band, respectively via bandpass filters BPF1 and BPF2. By operating the switch 52 to connect the antenna 51 to either the duplexer 53 or the duplexer 54, transmission and reception are performed on two frequency bands of 900 MHz and 1.8 GHz.

In the conventional arrangement, the receiver side duplexer and the transmitter side duplexer are connected to the single antenna via the switch, and since a plurality of transmitter side high-power amplifiers working on different frequency bands and a plurality of receiver side low-noise amplifiers working on different frequency bands are connected to the respective duplexers, via the respective bandpass filters, the component counts of the system increases. This arrangement makes it difficult to implement compact design in the mobile communications apparatuses.

SUMMARY OF THE INVENTION

The present invention has been developed to resolve this problem, and it is an object of the present invention to provide a filter that works with high-frequency signals in a plurality of frequency bands that are relatively close to each other in frequency.

A preferred embodiment of the present invention provides a filter, comprising an LC resonance circuit comprising at least one inductance element, at least one capacitance element, and at least one switching element.

According to the above structure, an overall inductance value or an overall capacitance value of the LC resonance circuit can be controlled by controlling the voltage supplied to the switching element, and as a result, the resonance frequency of the filter can be controlled. Since the frequency band of the filter is changed, a single filter can handle two high-frequency signals in two different frequency bands.

By using the filter in mobile communications apparatuses having a plurality of frequency bands relatively close to each other in frequency, the antenna, the high-power amplifier on the transmitter side and the low-noise amplifier on the receiver side are shared by these two apparatuses.

In the above described filter, the inductance element, the capacitance element and the switching element may be embedded in or mounted onto a laminate body into which a plurality of dielectric layers are laminated.

According to the above structure, the inductance element, the capacitance element and the switching element are embedded in or mounted on the laminate body. This arrangement permits a compact filter design.

In the above described filter, the inductance element, the capacitance element and the switching element are preferably electrically connected through connecting means formed in the laminate body.

The above described filter, needs no external connecting means therewithin because the inductance element, the capacitance element, and the switching element are electrically connected using the connecting means provided in the laminate body. When mounted, the filter is thus free from shortcircuits with onboard wirings and other mounted components.

In the above described filter, at least one of the inductance elements embedded in the laminate body may comprise a transmission line comprising a plurality of transmission line conductors that are electrically connected in series so that the plurality of transmission line conductors generally face to each other in the direction of lamination of the laminate body with the dielectric layer interposed therebetween and so that the directions of travel of high-frequency signals that travel along two adjacent transmission line conductors of the plurality of transmission line conductors are the same.

The above described filter comprises the transmission line of the inductance element constructed of a plurality of transmission line conductors, and given a constant characteristic impedance of the transmission line, the length of the transmission line conductor per layer is half the length of the conventional transmission line conductor. This arrangement permits a compact filter design.

Since the directions of travel of high-frequency signals travelling along the two transmission line conductors that are adjacent to each other with the dielectric layer forming the laminate body therebetween are the same, the directions of magnetic fluxes generated around the transmission line conductors are the same. By narrowing the separation between the two adjacent transmission line conductors, the degree of coupling of the two adjacent transmission line conductors is increased, and the desired characteristic impedance is thus easily obtained.

This arrangement compensates for a drop in characteristic impedance of the transmission lines arising from the effect of stray capacitance generated between the transmission lines and the ground electrodes, even if the transmission lines are arranged between the two ground electrodes to shield the transmission lines from external electromagnetic noise, and a high characteristic impedance in the transmission lines thus results. As a result, the insertion loss of the filter is lowered, and the shrink of the band is prevented. A filter having excellent frequency characteristics thus results.

Other features and advantages of the present invention will become apparent from the following description of the invention which refers to the accompanying drawings.

DETAILED DESCRIPTION OF THE DRAWINGS

Figure 1:
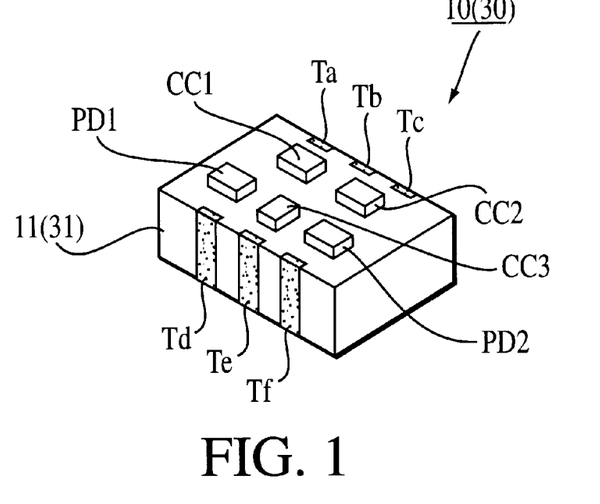
FIG. 1 is a perspective view of one preferred embodiment of the filter of the present invention.

FIG. 1 is a perspective view showing one preferred embodiment of the filter of the present invention. A filter 10 (30) includes a laminate body 11 (31), and PIN diodes PD1 and PD2 of switching elements, and choke coils CC1–CC3 are mounted on a top surface, which is one of the two principal faces of the laminate body 11 (31), and six external electrodes Ta–Tf extend along a side surface face from the top surface to the bottom surface of the laminate body 11 (31).

Three external electrodes Ta–Tc of the external electrodes Ta–Tf are formed on one side surface of the laminate body 11 (31), and three other external electrodes Td–Tf are formed on the opposite side surface of the laminate body 11 (31). The external electrode Ta is an input terminal, the external electrodes Tb and Te are control terminals for controlling the voltage supplied to the PIN diode PD, the external electrode Tc is an output terminal, and the external electrodes Td and Tf are ground terminals.

Figure 2:
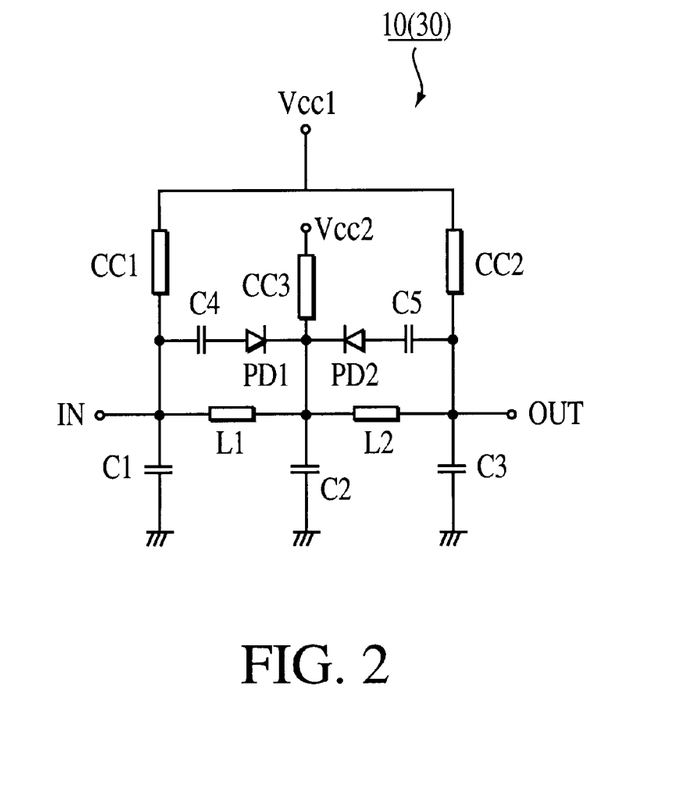
FIG. 2 is a schematic diagram of the filter of FIG. 1.

FIG. 2 is a schematic diagram of the filter 10 (30) shown in FIG. 1. The filter 10 (30) is a fifth-order low-pass filter, and includes an LC resonance circuit composed of transmission lines L1 and L2 that are inductance elements, five capacitance elements, namely, capacitors C1–C5, and two PIN diodes PD1 and PD2, and three choke coils CC1–CC3.

The transmission lines L1 and L2 and capacitors C1–C3 are configured in a π network between an input terminal IN and an output terminal OUT, a series network of the capacitor C4 and the PIN diode PD1 is connected in parallel with the transmission line L1, and a series network of the capacitor C5 and the PIN diode PD2 is connected in parallel with the transmission line L2.

Connected between the input terminal IN of the capacitor C4 and the output terminal OUT of the capacitor C5 are choke coils CC1 and CC2, and a control terminal Vcc1 is connected to the node of the choke coils CC1 and CC2. A control terminal Vcc2 is connected to the node of the PIN diodes PD1 and PD2 via the choke coil CC3.

The choke coils CC1–CC3 serve the purpose of preventing a high-frequency signal from flowing into the control terminals Vcc1 and Vcc2 when power is supplied to the PIN diodes PD1 and PD2.

Figure 3:
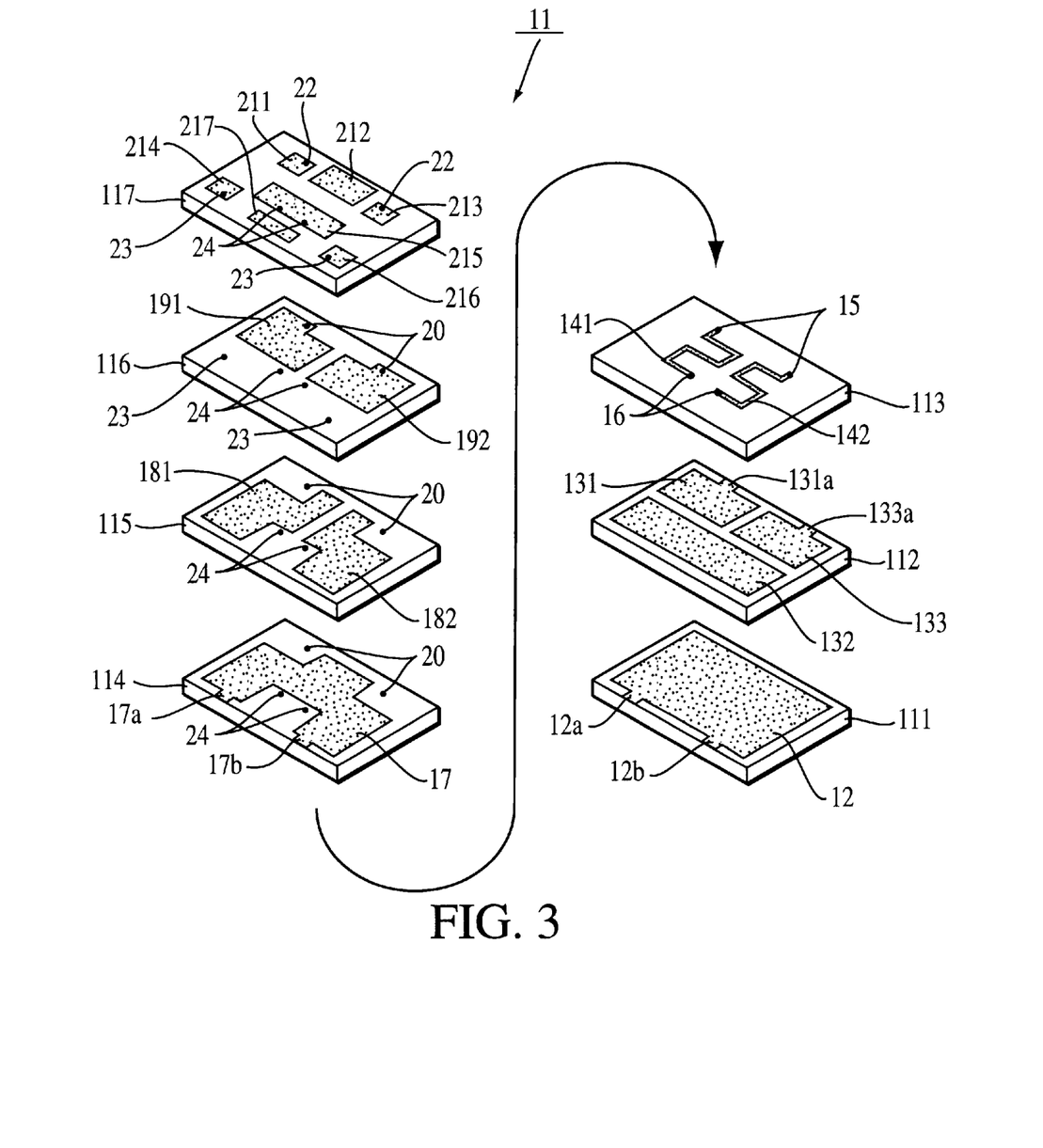
FIG. 3 is an exploded perspective view of a laminate body forming the filter of FIG. 1.

FIG. 3 shows an exploded perspective view of the laminate body 11 that forms the filter 10. The laminate body 11 is constructed of first—seventh dielectric layers 111–117. The top surface of the first dielectric layer 111 is almost entirely covered with a ground electrode 12. Terminals 12a and 12b extend from the ground electrode 12 toward one side of the first dielectric layer 111.

The second dielectric layer 112 is laminated on top of the ground electrode 12, and the top surface of the second dielectric layer 112 is covered with capacitor electrodes 131–133 that form parts of the respective capacitors C1–C3 (FIG. 2) of the capacitance elements. The capacitor electrodes 131 and 133 are spaced with a spacing therebetween on the rear right area and the rear left area on the top surface of the second dielectric layer 112, and the capacitor electrode 132 is formed in a rectangular shape on the front area of the surface of the second dielectric layer 112. Connecting terminals 131a and 133a respectively extend from the capacitor electrodes 131 and 133 toward one side of the second dielectric layer 112, with a spacing allowed therebetween.

The third dielectric layer 113 is laminated on top of the capacitor electrodes 131–133, and generally meandering transmission line conductors 141 and 142, forming the transmission lines L1 and L2 as the inductance elements, are arranged on the top surface of the third dielectric layer 113. Via hole electrodes 15 are formed in the third dielectric layer 113 to electrically connect ends of the transmission line conductors 141 and 142 respectively to the capacitor electrodes 131 and 133 on the second dielectric layer 112. Furthermore, via hole electrodes 16 are formed in the third dielectric layer 113 to electrically connect the other ends of the transmission lines 141 and 142 respectively to the capacitor electrode 132 on the second dielectric layer 112.

The fourth dielectric layer 114 is laminated on top of the transmission lines 141 and 142, and the top surface of the fourth dielectric layer 114 is generally covered with a ground electrode 17. Two terminals 17a and 17b extend from the ground electrode 17 toward one side of the fourth dielectric layer 114.

The fifth dielectric layer 115 is laminated on top of the ground electrode 17, and arranged on top of the fifth dielectric layer 115 are two capacitor electrodes 181 and 182 that form parts of the capacitors C4 and C5 (FIG. 2) as the capacitance elements. The capacitor electrodes 181 and 182 are arranged with a spacing therebetween, on the right side area and left side area on the fifth dielectric layer 115.

The sixth dielectric layer 116 is laminated on top of the capacitor electrodes 181 and 182, and two capacitor electrodes 191 and 192, forming parts of the capacitors C4 and C5 (FIG. 2) as the capacitance elements, are arranged on top of the sixth dielectric layer 116 so that they respectively face the capacitor electrodes 181 and 182 on the fifth dielectric layer 115. Via hole electrodes 20 are formed in the fourth—sixth dielectric layers 114–116 to electrically connect the capacitor electrodes 191 and 192 to the respective ends of the transmission line conductors 141 and 142 on the third dielectric layer 113.

The seventh dielectric layer 117 is laminated on top of the capacitor electrodes 191 and 192, and lands 211–217 for mounting PIN diodes PD1 and PD2 and choke coils CC1–CC3 are formed on the surface of the seventh dielectric layer 117. Lands 211–213 are respectively arranged on a rear center area and rear left and rear right areas on the top surface of the seventh dielectric layer 117, and lands 214–216 are respectively arranged on a front center area and front right and front left areas on the top surface of the seventh dielectric layer 117, and land 217 is arranged on the front center area on the top surface of the seventh dielectric layer 117. Via hole electrodes 22 are formed in the seventh dielectric layer 117 to electrically connect the lands 211 and 213 respectively to the capacitor electrodes 191 and 192 on the sixth dielectric layer 116. Via hole electrodes 23 are formed in the sixth and seven dielectric layers 116 and 117 to electrically connect the lands 214 and 216 to the capacitor electrodes 181 and 182 on the fifth dielectric layer 115. Via hole electrodes 24 are formed in the fourth—seventh dielectric layers 114–117 to electrically connect the land 215 to the other ends of the transmission line conductors 141 and 142 on the third dielectric layer 113.

The laminate body 11 is manufactured by laminating dielectric ceramic green sheets into each of the first—seventh dielectric layers 111–117, by applying electrode paste in the forms of the ground electrodes 12 and 17, capacitor electrodes 131–133, 181, 182, 191 and 192, transmission line conductors 141 and 142, lands 211–217, extension terminals 12a, 12b, 131a, 133a, 19a, 19b, 212a, and 215a on the first—seventh layers 111–117, by laminating and then calcining them together. The number of dielectric ceramic green sheets to be laminated is adjusted depending on the thickness of each of the first—seventh dielectric ceramic layers 111–117.

To form the external electrodes Ta–Tf, electrode paste is applied prior to the calcination of the laminate body 11, and they are calcined together, or the external electrodes Ta–Tf in paste may be applied onto the calcined laminate body 11 after it is calcined.

On the top surface of the laminate body 11 thus constructed, the land 212 on the seventh dielectric layer 117 is connected to the external terminal Tb (FIG. 1) working as the control terminal Vcc1, and the land 217 on the seventh dielectric layer 117 is connected to the external terminal Te (FIG. 1) working as the control terminal Vcc2.

On one side of the laminate body 11, the extension terminal 131a formed on the capacitor electrode 131 on the second dielectric layer 112 is connected to the external terminal Ta (FIG. 1) working as the input terminal IN, the extension terminal 133a formed on the capacitor electrode 133 on the second dielectric layer 112 is connected to the external terminal Tc (FIG. 1) working as the output terminal OUT, and the extension terminals 12a and 12b formed on the ground electrode 12 on the first dielectric layer 111 and the extension terminals 17a and 17b formed on the ground electrode 17 on the fourth dielectric layer 114 are respectively connected to the external terminals Td and Tf (FIG. 1).

The choke coil CC1 is connected between lands 211 and 212 formed on the top surface of the laminate body 11, the choke coil CC2 is connected between lands 212 and 213, PIN diode PD1 is connected between lands 214 and 215, PIN diode PD2 is connected between lands 215 and 216, the choke coil CC3 is connected between lands 215 and 217, and the filter 10 is thus constructed.

The transmission lines L1 and L2 (FIG. 2) constituting the filter 10 are constructed of the transmission line conductors 141 and 142 on the third dielectric layer 113.

The capacitors C1–C3 (FIG. 2) constituting the filter 10 are constructed of the capacitor electrodes 131–133 formed on the second dielectric layer 112 and the ground electrode 12 formed on the first dielectric layer 111.

The capacitors C4 and C5 (FIG. 2) constituting the filter 10 are constructed of the capacitor electrodes 181 and 182 formed on the fifth dielectric layer 115 and the capacitor electrodes 191 and 192 formed on the sixth dielectric layer 116.

Figure 4A:
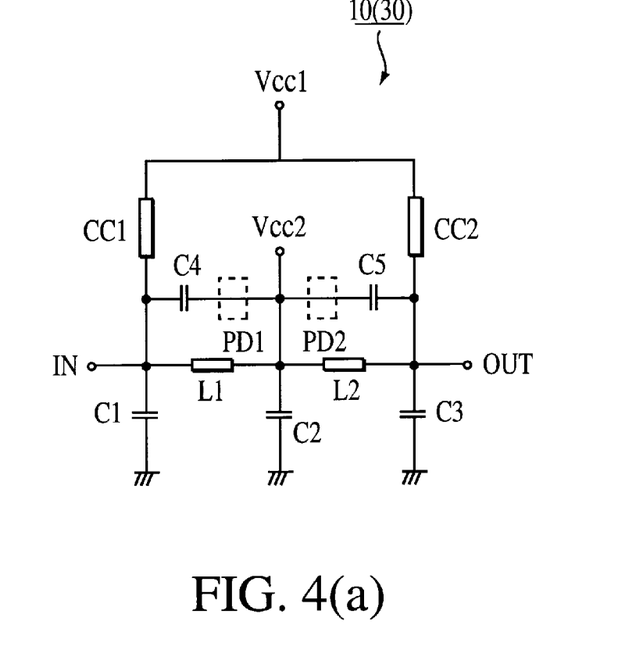
FIG. 4(a) is an equivalent circuit of the filter of FIG. 1 when PIN diodes in the filter are ON and FIG. 4(b) is a schematic diagram of the filter of FIG. 1 when the PIN diodes are OFF.

The equivalent circuit of the filter 10 with PIN diodes PD1 and PD2 on is shown in FIG. 4(a) because PIN diodes PD1 and PD2 are closed. The parallel resonance capacitors of the LC resonance circuit, composed of the transmission lines L1 and L2, capacitors C1–C5, and PIN diodes PD1 and PD2, are capacitors C4 and C5.

Figure 4B:
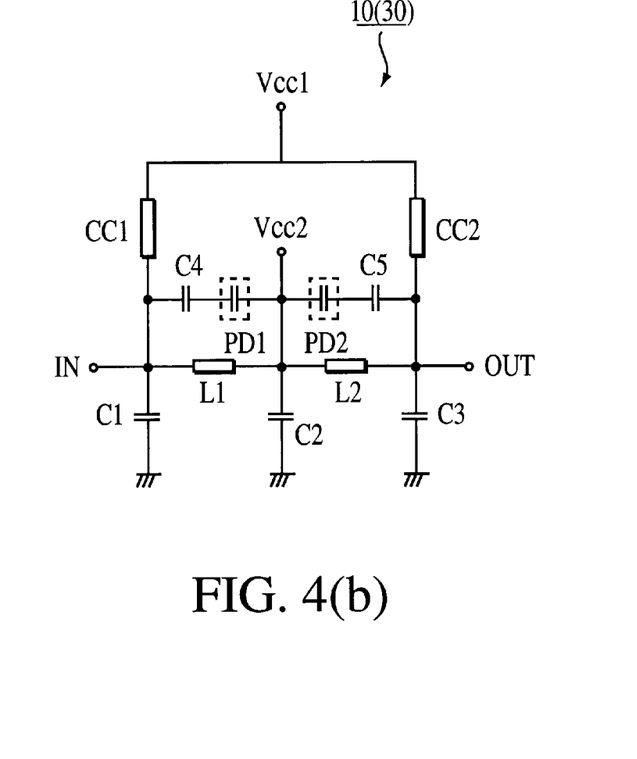

The equivalent circuit of the filter 10 with PIN diodes PD1 and PD2 off is shown in FIG. 4(b) because PIN diodes PD1 and PD2 are opened. The parallel resonance capacitors of the LC resonance circuit, composed of the transmission lines L1 and L2, capacitors C1–C5, and PIN diodes PD1 and PD2, are capacitors C4 and C5 and PIN diodes PD1 and PD2.

With this arrangement, the resonance frequency of the filter 10 is changed by switching on and off PIN diodes PD1 and PD2.

Figure 5:
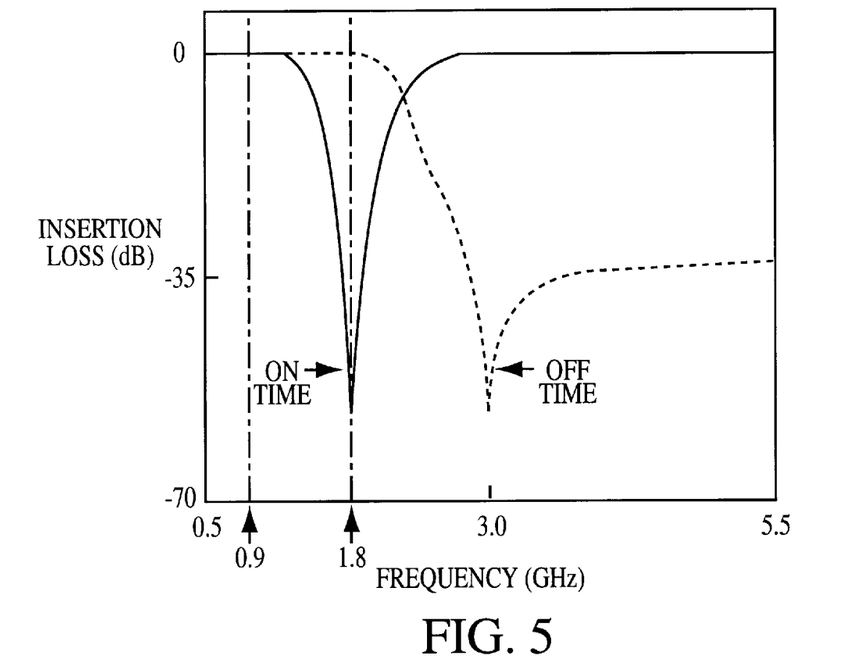
FIG. 5 shows the frequency characteristics of the filter constructed of the laminate body shown in FIG. 3.

FIG. 5 shows the passband characteristic of the filter 10. Referring to FIG. 5, a full line represents the passband characteristic when the PIN diodes PD are on, while a dotted line represents the passband characteristic when the PIN diodes PD are off. As can be seen from FIG. 5, (1) a high-frequency signal in the 900 MHz band is passed through when the PIN diodes PD are on (Vcc1=3 V, Vcc2=0 V), and (2) a high-frequency in the 1.8 GHz band is passed through when the PIN diodes PD are off (Vcc1=0 V, Vcc2=3 V).

Figure 6:
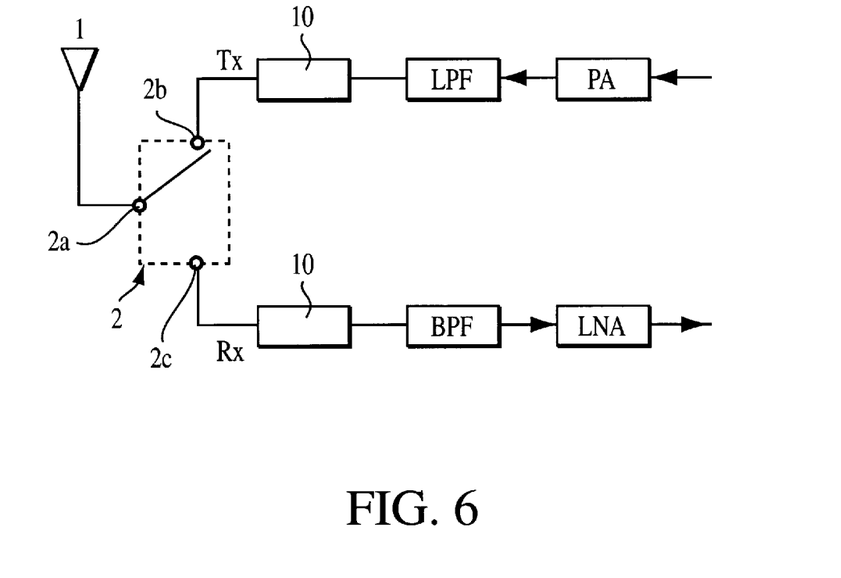
FIG. 6 is a block diagram of a system in which an antenna is shared by mobile communications apparatuses working on different frequency bands using the filter of FIG. 1.

FIG. 6 shows an example, in which the filter 10 is used with a single antenna which is shared by the GSM (Global System for Mobile communications) that is a 900 MHz band portable telephone system, and the DCS (Dynamic Cell system) that is a 1.8 GHz band portable telephone system.

The antenna 1 is connected to a first terminal 2a of a switch 2, composed of a coaxial switch and a PIN diode, and terminals of filters 10 are respectively connected to second and third terminals 2b and 2c of the switch 2, namely, transmitter and receiver terminals, respectively. The other terminals of the filters 10 are respectively connected to a transmitter (Tx) side high-power amplifier PA that is shared by the 900 MHz band GSM and the 1.8 GHz band DCS and to a receiver (Rx) side low-noise amplifier LNA that is shared by the 900 MHz band GMS and the 1.8 GHz band DCS.

With the switch 2 operated in the above arrangement, the single antenna 1 is connected to the transmitter (Tx) side filter 10 and the receiver (Rx) side filter 10, both working with two different frequency bands, and when PIN diodes PD1 and PD2 in the filter 10 are on, the GSM frequency, namely 900 MHz only, is passed therethrough and when PIN diodes PD1 and PD2 in the filter 10 are off, the DCS frequency, namely, 1.8 GHz only, is passed therethrough.

The GSM high-frequency signal in the 900 MHz band and DCS 1800 high-frequency signal in the 1.8 GHz band are distributed or combined so that transmission and reception are performed in the two frequency bands.

In GSM and DCS working in two relatively close frequency bands, namely, the 900 MHz band and the 1.8 GHz band, the antenna, the high-power amplifier on the transmitter side and the low-noise amplifier on the receiver side are shared by these two systems.

The above-described filter changes the resonance frequency of the LC resonance circuit composed of the transmission lines, the capacitors and the PIN diodes, by changing the voltage applied to the PIN diodes, namely, by switching on and off the PIN diodes. Since the frequency band of the low-pass filter is changed, a single filter handles two high-frequency signals in two different frequency bands.

When the filter is constructed of a laminate body as shown in FIG. 1, the transmission lines and the capacitors are embedded into the laminate body, permitting a compact design in the filter.

The filter needs no external connecting means therewithin because the transmission lines, capacitors and PIN diodes are electrically connected using the via holes formed in the laminate body. When mounted, the filter is thus free from shortcircuits with onboard wirings and other mounted components.

Figure 7:
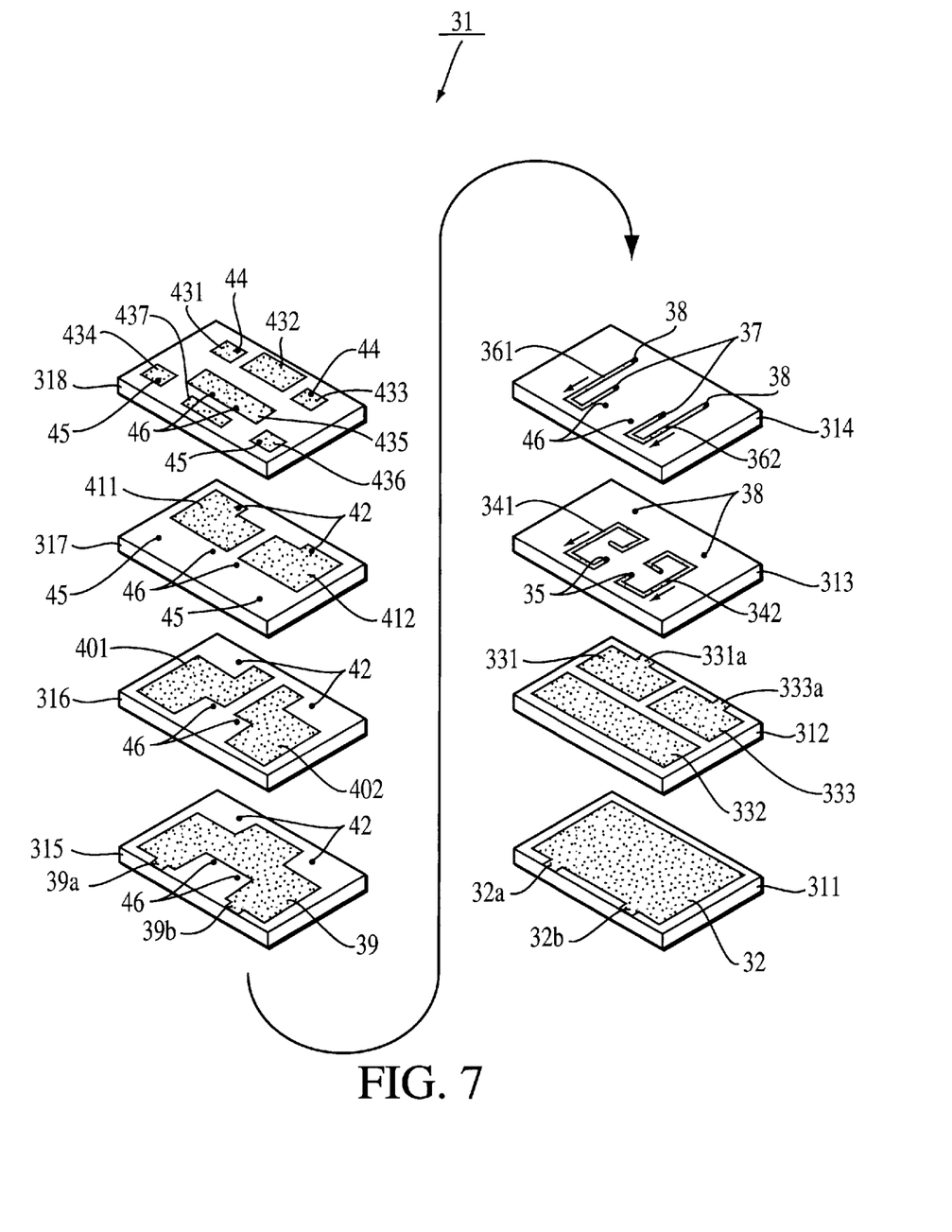
FIG. 7 is an exploded perspective view of another laminate body forming the filter of FIG. 1.

FIG. 7 is an exploded perspective view of another laminate body constituting the filter shown in FIG. 1. The laminate body 31 is manufactured by laminating first eighth dielectric layers 311–318. The top surface of the first dielectric layer 311 is almost entirely covered with a ground electrode 32. Two terminals 32a and 32b extend from the ground electrode 32 toward one side of the first dielectric layer 311.

The second dielectric layer 312 is laminated on top of the ground electrode 32, and the top surface of the second dielectric layer 312 is covered with capacitor electrodes 331–333 that form parts of the respective capacitors C1–C3 (FIG. 2) of the capacitance elements. The capacitor electrodes 331 and 333 are spaced with a spacing therebetween on the rear right area and rear left area on the second dielectric layer 312, and the capacitor electrode 332 is formed in a rectangular shape on the front area of the surface of the second dielectric layer 312. Connecting terminals 331a and 333a respectively extend from the capacitor electrodes 331 and 333 toward one side of the second dielectric layer 312, with a spacing therebetween.

The third dielectric layer 313 is laminated on top of the capacitor electrodes 331–333, and generally meandering transmission line conductors 341 and 342, forming the transmission lines L1 and L2 as the inductance elements, are arranged on the top surface of the third dielectric layer 313. Via hole electrodes 35 are formed in the third dielectric layer 313 to electrically connect ends of the transmission line conductors 341 and 342 respectively to the capacitor electrodes 331 and 333 on the second dielectric layer 312.

The fourth dielectric layer 314 is laminated on top of the transmission line conductors 341 and 342, and generally meandering transmission line conductors 361 and 362, forming the transmission lines L1 and L2 as the inductance elements, are arranged on the top surface of the fourth dielectric layer 314 in a manner such that they respectively face the transmission line conductors 341 and 342. Via hole electrodes 37 are formed in the fourth dielectric layer 314 to electrically connect ends of the transmission line conductors 361 and 362 respectively to the other ends of the transmission line conductors 341 and 342 on the third dielectric layer 313. Via hole electrodes 38 are formed in the third dielectric layer 313 and fourth dielectric layer 314 to electrically connect the other ends of the 361 and 362 respectively to the capacitor electrodes 331 and 332 on the second dielectric layer 312.

The fifth dielectric layer 315 is laminated on top of the transmission line conductors 361 and 362, and the top surface of the fifth dielectric layer 315 is generally covered with a ground electrode 39. Two terminals 39a and 39b extend from the ground electrode 39 toward one side of the fifth dielectric layer 315.

The sixth dielectric layer 316 is laminated on top of the ground electrode 39, and arranged on top of the sixth dielectric layer 316 are two capacitor electrodes 401 and 402 that form parts of the capacitors C4 and C5 (FIG. 2) as the capacitance elements. The capacitor electrodes 401 and 402 are arranged with a spacing therebetween, on the right side area and left side area on the sixth dielectric layer 316.

The seventh dielectric layer 317 is laminated on top of the capacitor electrodes 401 and 402, and two capacitor electrodes 411 and 412, forming parts of the capacitors C4 and C5 (FIG. 2) as the capacitance elements, are arranged on top of the seventh dielectric layer 317 so that they respectively face the capacitor electrodes 401 and 402 on the sixth dielectric layer 316. Via hole electrodes 42 are formed in the fifth–seventh dielectric layers 315–317 to electrically connect the capacitor electrodes 411 and 412 to the respective ends of the transmission line conductors 361 and 362 on the fourth dielectric layer 314.

The eighth dielectric layer 318 is laminated on top of the capacitor electrodes 411 and 412, and lands 431–437 for mounting PIN diodes PD1 and PD2 and choke coils CC1–CC3 are formed on the surface of the eighth dielectric layer 318. Lands 431–433 are respectively arranged on a rear center area and rear left and rear right areas on the top surface of the eighth dielectric layer 318, and lands 434–436 are respectively arranged on a front center area and front right and front left areas on the top surface of the eighth dielectric layer 318, and land 437 is arranged on the front center area on the top surface of the eighth dielectric layer 318. Via hole electrodes 44 are formed in the eighth dielectric layer 318 to electrically connect the lands 431 and 433 respectively to the capacitor electrodes 411 and 412 on the seventh dielectric layer 317. Via hole electrodes 45 are formed in the seventh and eighth dielectric layers 317 and 318 to electrically connect the lands 434 and 436 to the capacitor electrodes 401 and 402 on the sixth dielectric layer 316. Via hole electrodes 46 are formed in the fourth—eighth dielectric layers 314–318 to electrically connect the land 435 to the ends of the transmission line conductors 341 and 342 on the third dielectric layer 313.

On the top surface of the laminate body 31 thus constructed, the land 432 on the eighth dielectric layer 318 is connected to the external terminal Tb (FIG. 1) working as the control terminal Vcc1, and the land 437 on the eighth dielectric layer 318 is connected to the external terminal Te (FIG. 1) working as the control terminal Vcc2.

On one side surface of the laminate body 31, the extension terminal 331a formed on the capacitor electrode 331 on the second dielectric layer 312 is connected to the external terminal Ta (FIG. 1) working as the input terminal IN, the extension terminal 333a formed on the capacitor electrode 333 on the second dielectric layer 312 is connected to the external terminal Tc (FIG. 1) working as the output terminal OUT, and the extension terminals 32a and 32b formed on the ground electrode 32 on the first dielectric layer 311 and the extension terminals 39a and 39b formed on the ground electrode 39 on the fifth dielectric layer 315 are respectively connected to the external terminals Td and Tf (FIG. 1).

The choke coil CC1 is connected between lands 431 and 432 formed on the top surface of the laminate body 31, the choke coil CC2 is connected between lands 432 and 433, PIN diode PD1 is connected between lands 434 and 435, PIN diode PD2 is connected between lands 435 and 436, the choke coil CC3 is connected between lands 435 and 437, and the filter 30 is thus constructed.

The transmission lines L1 and L2 (FIG. 2) constituting the filter 30 are created by electrically serially connecting the transmission line conductors 341 and 342 formed on the third dielectric layer 313 respectively to the transmission line conductors 361 and 362 formed on the fourth dielectric layer 314 via the via hole electrodes 37 formed in the fourth dielectric layer 314 so that the directions of travel of the high-frequency signals are the same (arrows in FIG. 6). Specifically, unlike the filter 10 of the laminate body 11 shown in FIG. 3, the filter 30 comprises the transmission line L1 that is constructed of two transmission line conductors 341 and 361 and the transmission line L2 that is constructed of two transmission line conductors 342 and 362.

The capacitors C1–C3 (FIG. 2) constituting the filter 30 are constructed of the capacitor electrodes 331–333 formed on the second dielectric layer 312 and the ground electrode 32 formed on the first dielectric layer 311.

The capacitors C4 and C5 (FIG. 2) constituting the filter 30 are constructed of the capacitor electrodes 401 and 402 formed on the sixth dielectric layer 316 and the capacitor electrodes 411 and 412 formed on the seventh dielectric layer 317.

The equivalent circuit of the filter 30 with PIN diodes PD1 and PD2 on is shown in FIG. 4(a) as in the filter 10 formed on the laminate body 11 shown in FIG. 3 because PIN diodes PD1 and PD2 are closed. The parallel resonance capacitors of the LC resonance circuit, composed of the transmission lines L1 and L2, capacitors C1–C5, and PIN diodes PD1 and PD2, are capacitors C4 and C5.

The equivalent circuit of the filter 10 with PIN diodes PD1 and PD2 off is shown in FIG. 4(b) as in the filter 10 formed on the laminate body 11 shown in FIG. 3 because PIN diodes PD1 and PD2 are opened. The parallel resonance capacitors of the LC resonance circuit, composed of the transmission lines L1 and L2, capacitors C1–C5, and PIN diodes PD1 and PD2, are capacitors C4 and C5 and PIN diodes PD1 and PD2.

With this arrangement, the resonance frequency of the filter 30 is changed by switching on and off PIN diodes PD1 and PD2.

Figure 8:
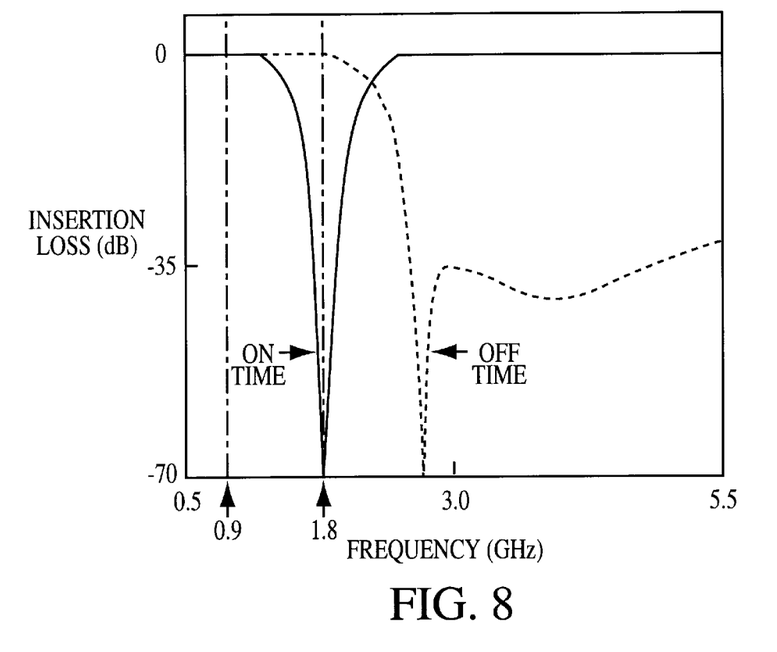
FIG. 8 shows the frequency characteristics of the filter constructed of the laminate body shown in FIG. 7.

FIG. 8 shows the passband characteristic of the filter 30. Referring to FIG. 8, a full line represents the passband characteristic when PIN diodes PD1 and PD2 are on, while a dotted line represents the passband characteristic when PIN diodes PD1 and PD2 are off. As can be seen from FIG. 8, (1) a high-frequency signal in the 900 MHz band is passed through when the PIN diodes PD are on (Vcc1=3 V, Vcc2=0 V), and (2) a high-frequency in the 1.8 GHz band is passed through when the PIN diodes PD are off (Vcc1=0 V, Vcc2=3 V).

The filter 30 constructed of the laminate body 31 presents a smaller minimum value of insertion loss than the filter 10 (see FIG. 5) constructed of the laminate body 11, and the insertion loss of the filter 30 sharply drops down to its minimum value, leading to a lowered minimum insertion loss and wideband characteristic.

In the above filter, the transmission lines are constructed of two transmission line conductors that are adjacent to each other with the dielectric layer forming the laminate body therebetween, and given a constant characteristic impedance of the transmission line, the length of the transmission line conductor per layer is half the length of the conventional transmission line conductor. Even though the filter of the second preferred embodiment is smaller than the filter of the first embodiment in size, the filter of the second preferred embodiment results in a predetermined value in characteristic impedance of the transmission line, and a compact filter thus results.

Since the directions of travel of high-frequency signals travelling along the two transmission line conductors that are adjacent to each other with the dielectric layer forming the laminate body therebetween are the same, the directions of magnetic fluxes generated around the transmission line conductors are the same. The two adjacent transmission line conductors with the dielectric layer therebetween are electromagnetically coupled through the magnetic fluxes that circle in the same direction, and magnetic fluxes circling around and centered on the two adjacent transmission line conductors are generated in a region where the two adjacent transmission line conductors are aligned.

By narrowing the separation between the two adjacent transmission line conductors, the degree of coupling of the two adjacent transmission line conductors is increased, and the desired characteristic impedance is thus easily obtained. This arrangement compensates for a drop in characteristic impedance of the transmission lines arising from the effect of stray capacitance generated between the transmission lines and the ground electrodes, even if the transmission lines are arranged between the two ground electrodes to shield the transmission lines from external electromagnetic noise, and a high characteristic impedance in the transmission lines thus results. A filter having excellent frequency characteristics thus results.

The filters in the first and second preferred embodiments are a low-pass filter, but as long as a filter forms the LC resonance circuit, like a high-pass filter, a band-pass filter, and a band-elimination filter, that filter falls within the scope of the present invention.

The receiver side filter and transmitter side filter forming high-frequency components, discussed above, are both band-pass filters, but filters of different types may be combined, for example, a low-pass filter with a high-pass filter, a band-pass filter with a band-elimination filter, and a band-elimination filter with a band-elimination filter.

A PIN diode is used for the switching element in the above discussion, but a vari-cap diode, a bipolar transistor, or a field-effect transistor may work instead.

Although a via hole electrode is used for the connecting means in the above discussion, a through-hole electrode may equally work.

A chip inductor, a resistor, or a strip line may be used for the choke coil.

In the above discussion, the inductance elements and the capacitance elements are laminated between the dielectric layers to be embedded in the laminate body, but a chip component may be mounted on a laminate body.

Although the switching element is mounted on the laminate body in the above discussion, cavities may be formed in the laminate body, and the switching element may be placed into the cavities.

In the second preferred embodiment, the transmission line is constructed of two transmission line conductors, but it may be constructed of three or more transmission line conductors instead. In such a case, the more the number of transmission line conductors forming the transmission line, the more compact the filter becomes in size.

While the invention has been particularly shown and described with reference to preferred embodiments thereof, it will be understood by those skilled in the art that the foregoing and other changes in form and details may be made therein without departing from the spirit of the invention.

What is claimed is:

1. A filter operable at first and second frequencies, comprising:

an LC resonance circuit comprising at least one inductance element, at least one capacitance element, and at least one switching element;

wherein said switching element has negligible capacitance, causing said LC resonance circuit to resonate at said first frequency, when said switching element is ON, and has a capacitance causing said LC resonance circuit to resonate at said second frequency when said switching element is OFF.

2. The filter according to claim 1, wherein:

said inductance element, said capacitance element and said switching element are embedded in or mounted onto a laminate body into which a plurality of dielectric layers are laminated.

3. The filter according to claim 2, wherein:

said inductance element, said capacitance element and said switching element are electrically connected through a connector provided in said laminate body.

4. The filter according to claim 3, wherein:

at least one of said inductance elements embedded in said laminate body comprises a transmission line, said transmission line comprising a plurality of transmission line conductors that are electrically connected in series so that said plurality of transmission line conductors generally face each other in the direction of lamination of said laminate body with one of said dielectric layers interposed therebetween and so that the directions of travel of high-frequency signals that travel along two adjacent transmission line conductors of said plurality of transmission line conductors are the same.

5. The filter according to claim 2, wherein:

at least one of said inductance elements embedded in said laminate body comprises a transmission line, said transmission line comprising a plurality of transmission line conductors that are electrically connected in series so that said plurality of transmission line conductors generally face to each other in the direction of lamination of said laminate body with one of said dielectric layers interposed therebetween and so that the directions of travel of high-frequency signals that travel along two adjacent transmission line conductors of said plurality of transmission line conductors are the same.

6. A filter according to claim 1, wherein said capacitance element and said switching element are connected in a series circuit.

7. A filter according to claim 6, wherein said switching element is a PIN diode.

8. A filter according to claim 6, wherein said series circuit of said capacitance element and said switching element is connected in parallel with said inductance element.

9. A filter according to claim 8, wherein said switching element is a PIN diode.

10. A filter according to claim 1, wherein said switching element is connected in parallel with said inductance element.

11. A filter according to claim 10, wherein said switching element is a PIN diode.

* * * * *